United States Patent
Koyama

(10) Patent No.: US 8,940,573 B2
(45) Date of Patent: Jan. 27, 2015

(54) METHOD OF MANUFACTURING SEMICONDUCTOR LIGHT-RECEIVING ELEMENT

(71) Applicant: Sumitomo Electric Device Innovations, Inc., Yokohama-shi, Kanagawa (JP)

(72) Inventor: Yuji Koyama, Yokohama (JP)

(73) Assignee: Sumitomo Electric Device Innovations, Inc., Yokohama-shi (JP)

( * ) Notice: Subject to any disclaimer, the term of this patent is extended or adjusted under 35 U.S.C. 154(b) by 77 days.

(21) Appl. No.: 13/838,241

(22) Filed: Mar. 15, 2013

(65) Prior Publication Data
US 2013/0252370 A1 Sep. 26, 2013

(30) Foreign Application Priority Data

Mar. 22, 2012 (JP) ................................ 2012-066398

(51) Int. Cl.
- H01L 21/00 (2006.01)
- H01L 33/60 (2010.01)
- H01L 31/0232 (2014.01)
- H01L 31/052 (2014.01)
- H01L 31/075 (2012.01)
- H01L 31/105 (2006.01)
- H01L 31/0224 (2006.01)

(52) U.S. Cl.
CPC .......... *H01L 33/60* (2013.01); *H01L 31/02327* (2013.01); *H01L 31/0524* (2013.01); *H01L 31/0527* (2013.01); *H01L 31/075* (2013.01); *H01L 31/105* (2013.01); *H01L 31/022416* (2013.01); *Y02E 10/52* (2013.01); *Y02E 10/548* (2013.01)
USPC ........................................... 438/71; 257/436

(58) Field of Classification Search
None
See application file for complete search history.

(56) References Cited

U.S. PATENT DOCUMENTS

| | | | | |
|---|---|---|---|---|
| 4,703,337 A | * | 10/1987 | Yamazaki | 257/436 |
| 6,690,079 B2 | * | 2/2004 | Fujimura et al. | 257/460 |
| 6,831,265 B2 | * | 12/2004 | Yoneda et al. | 250/214 R |
| 2003/0164444 A1 | | 9/2003 | Yoneda et al. | |
| 2006/0278898 A1 | * | 12/2006 | Shibayama | 257/228 |
| 2009/0130793 A1 | * | 5/2009 | Maeng et al. | 438/72 |
| 2011/0083722 A1 | * | 4/2011 | Atwater et al. | 136/246 |
| 2012/0042948 A1 | * | 2/2012 | Tsai | 136/256 |
| 2012/0097239 A1 | * | 4/2012 | Sato et al. | 136/256 |
| 2012/0133013 A1 | * | 5/2012 | Koyama | 257/434 |
| 2012/0273909 A1 | * | 11/2012 | Koyama | 257/432 |

FOREIGN PATENT DOCUMENTS

JP 2003-163364 A 6/2003

* cited by examiner

*Primary Examiner* — Andres Munoz
(74) *Attorney, Agent, or Firm* — Westerman, Hattori, Daniels & Adrian, LLP

(57) ABSTRACT

A method of manufacturing a semiconductor light-receiving element includes: forming a semiconductor layer structure having a one-conductivity-type semiconductor layer having a first conduction type located on a side of light incidence, an opposite-conductivity-type semiconductor layer having a second conduction type opposite to the first conduction type, and a light-absorbing layer between the one-conductivity-type semiconductor layer and the opposite-conductivity type semiconductor layer, the opposite-conductivity-type semiconductor layer having a structure in which a first semiconductor layer comprised of a binary mixed crystal, a second semiconductor layer comprised of a three-or-more-element mixed crystal, and a third semiconductor layer comprised of a three-or-more-element mixed crystal having an energy gap smaller than that of the second semiconductor layer are laminated in this order from the light incidence side; forming a metal film that is in contact with the third semiconductor layer; and performing a thermal process after the forming of the metal film.

12 Claims, 7 Drawing Sheets

COMPARATIVE EXAMPLE

FIG. 6　　　　　　　　MODIFIED EMBODIMENT
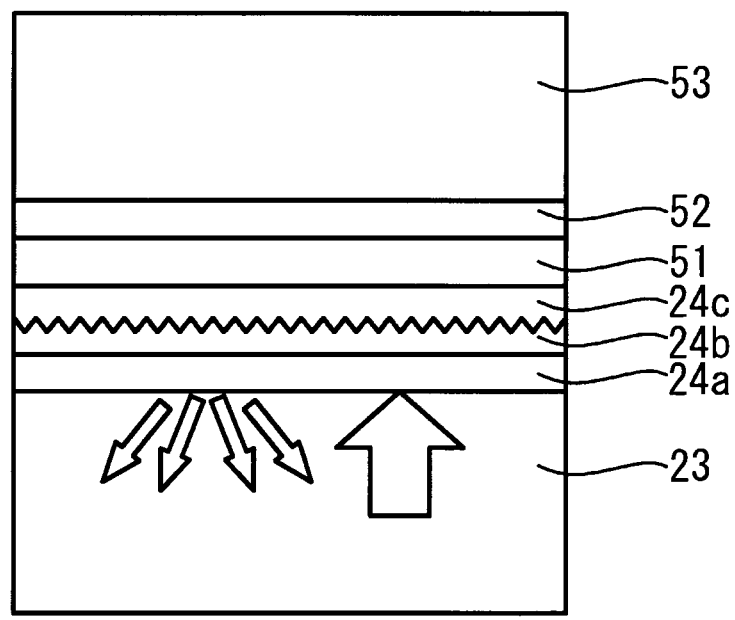

METHOD OF MANUFACTURING SEMICONDUCTOR LIGHT-RECEIVING ELEMENT

CROSS-REFERENCE TO RELATED APPLICATION

This application is based upon and claims the benefit of priority of the prior Japanese Patent Applications No. 2012-066398, filed on Mar. 22, 2012, the entire contents of which are incorporated herein by reference.

BACKGROUND (i) Technical Field

The present invention relates to a method of manufacturing a semiconductor light-receiving element.

(ii) Related Art

Japanese Patent Application Publication No. 2003-163364 discloses a semiconductor light-receiving element converting an incident light into an electrical current in which an electrode acts as a reflection mirror.

SUMMARY

It is an object to provide a method of manufacturing a semiconductor light-receiving element that is capable of manufacturing a semiconductor light-receiving element suppressing an ORL defect.

According to an aspect of the present invention, there is provided a method of manufacturing a semiconductor light-receiving element including: forming a semiconductor layer structure having a one-conductivity-type semiconductor layer having a first conduction type located on a side of light incidence, an opposite-conductivity-type semiconductor layer having a second conduction type opposite to the first conduction type, and a light-absorbing layer between the one-conductivity-type semiconductor layer and the opposite-conductivity type semiconductor layer, the opposite-conductivity-type semiconductor layer having a structure in which a first semiconductor layer comprised of a binary mixed crystal, a second semiconductor layer comprised of a three-or-more-element mixed crystal, and a third semiconductor layer comprised of a three-or-more-element mixed crystal having an energy gap smaller than that of the second semiconductor layer are laminated in this order from the light incidence side; forming a metal film that is in contact with the third semiconductor layer; and performing a thermal process after the forming of the metal film.

According to another aspect of the present invention, there is provided a method of manufacturing a semiconductor light-receiving element including: growing a one-conductivity-type semiconductor layer having a first conduction type, a light-absorbing layer and an opposite-conductivity type semiconductor layer having a second conduction type opposite to the first conduction type, in this order from a light incidence side; forming an insulating film on the opposite-conductivity-type semiconductor layer; forming a selective etching mask on a face of the insulating film; forming a concave and convex portion on the face of the insulating film by performing an etching against a part or all of a thickness of the insulating film exposed through the selective etching mask; and forming a metal film on the face of the insulating film including the concave and convex portion.

According to another aspect of the present invention, there is provided a method of manufacturing a semiconductor light-receiving element including: growing a one-conductivity-type semiconductor layer having a first conduction type, a light-absorbing layer, and an opposite-conductivity-type semiconductor layer having a second conduction type opposite to the first conduction type, in this order; enlarging a concave and convex portion of the insulating film in a face subjected to an etching compared to before the etching, by performing the etching to the insulating film; and forming a metal film on a face of the insulating film including the concave and convex portion.

BRIEF DESCRIPTION OF THE DRAWINGS

FIG. 6 illustrates a schematic cross sectional view of another example of a reflection mirror.

DETAILED DESCRIPTION

When a semiconductor light-receiving element of Japanese Patent Application Publication No. 2003-163364 is used, a reflection light may return to an outer light source. In this case, an ORL (Optical Return Loss) may be enlarged.

A description will be given of a comparative example before embodiments.

Comparative Example

Figure 1A:
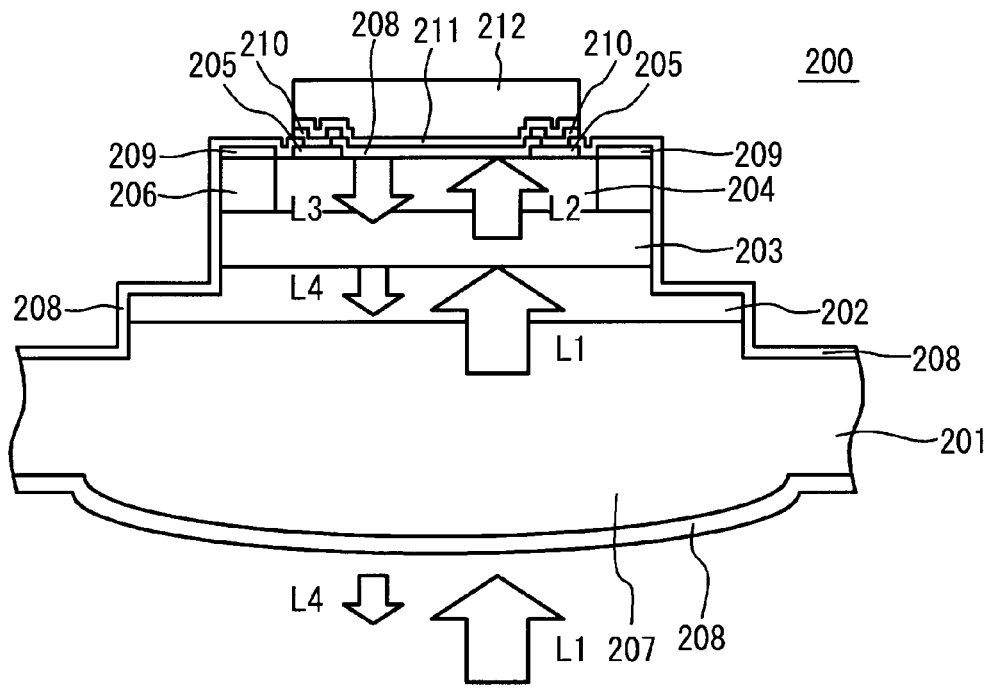
FIG. 1A illustrates a schematic cross sectional view of a semiconductor light-receiving element in accordance with a comparative example.

FIG. 1A illustrates a schematic cross sectional view of a semiconductor light-receiving element 200 in accordance with a comparative example. As illustrated in FIG. 1A, the semiconductor light-receiving element 200 has a structure in which an n-type semiconductor layer 202, an i-type semiconductor layer 203 and a p-type semiconductor layer 204 are laminated in this order on a semiconductor substrate 201. A contact layer 205 has a ring-shape and is laminated on the p-type semiconductor layer 204. A diameter of the p-type semiconductor layer 204 is smaller than that of the i-type semiconductor layer 203. An n-type semiconductor layer 206 is provided on a side face of the p-type semiconductor layer 204 in a region that is on the i-type semiconductor layer 203.

A lens 207 is formed on a back face of the semiconductor substrate 201. It is therefore possible to collect a light input into the back face of the semiconductor substrate 201. An insulating film 208 is made of a silicon nitride film (SiN) acting as an AR (Anti-Reflection) film. A diffusion mask 209 is provided between an upper face of the n-type semiconductor layer 206 and the insulating film 208.

The insulating film 208 has an opening on the contact layer 205. A Ti/Pt layer 210 acting as a barrier layer is provided in the opening of the insulating film 208 on the contact layer 205. The Ti/Pt layer 210 also has a ring shape because the contact layer 205 has a ring shape. An Au-sputtering layer 211 and an Au-plating layer 212 are laminated in this order from the Ti/Pt layer 210 to inner side thereof. Therefore, the Au-sputtering layer 211 and the insulating film 208 are in contact with each other in an inner side of the Ti/Pt layer 210.

Figure 1B:
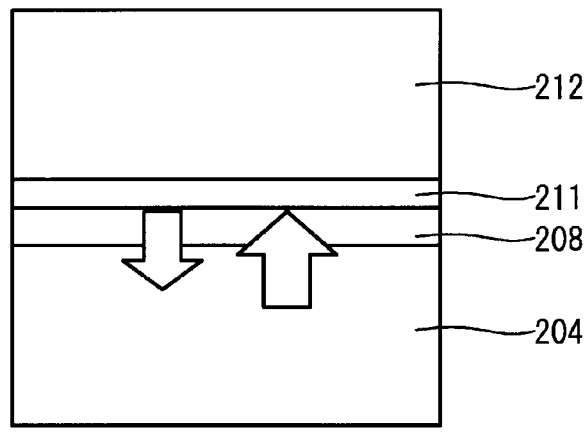
FIG. 1B illustrates an enlarged cross sectional view of the semiconductor light-receiving element.

FIG. 1B illustrates an enlarged schematic cross sectional view of an inner side portion relative to the contact layer 205 in the semiconductor light-receiving element 200. As illustrated in FIG. 1B, a lamination structure of the p-type semiconductor layer 204, the insulating film 208 (silicon nitride film) and the Au-sputtering layer 211 (Au) acts as a reflection mirror in an inner side relative to the contact layer 205 in the semiconductor light-receiving element 200. In concrete, the Au-sputtering layer 211 acts as a reflection mirror with respect to the p-type semiconductor layer 204. The Au-plating layer 212 is laminated on the Au-sputtering layer 211. A light input from the semiconductor substrate 201 side is reflected by an interface between the insulating film 208 and the Au-sputtering layer 211.

As illustrated in FIG. 1A, a part of a light L1 input from the lens 207 is absorbed by the i-type semiconductor layer 203 acting as a light-absorbing layer. A light L2 having passed through the i-type semiconductor layer 203 is reflected by an interface between the insulating film 208 and the Au-sputtering layer 211 and is input into the i-type semiconductor layer 203 as a light L3. A part of the light L3 is absorbed by the i-type semiconductor layer 203. A light L4 having passed through the i-type semiconductor layer 203 is output toward outer side via the lens 207. In this case, (light amount of the light L1-light amount of the light L2)+(light amount of the light L3-light amount of the light L4) contributes to carrier generation in the i-type semiconductor layer 203. On the other hand, an ORL defect may occur because the light L4 returns to a light source.

And so, a description will be given of a semiconductor light-receiving element and a manufacturing method thereof that are capable of suppressing the ORL defect by suppressing the light amount returning to a light source.

[First Embodiment]

Figure 2:
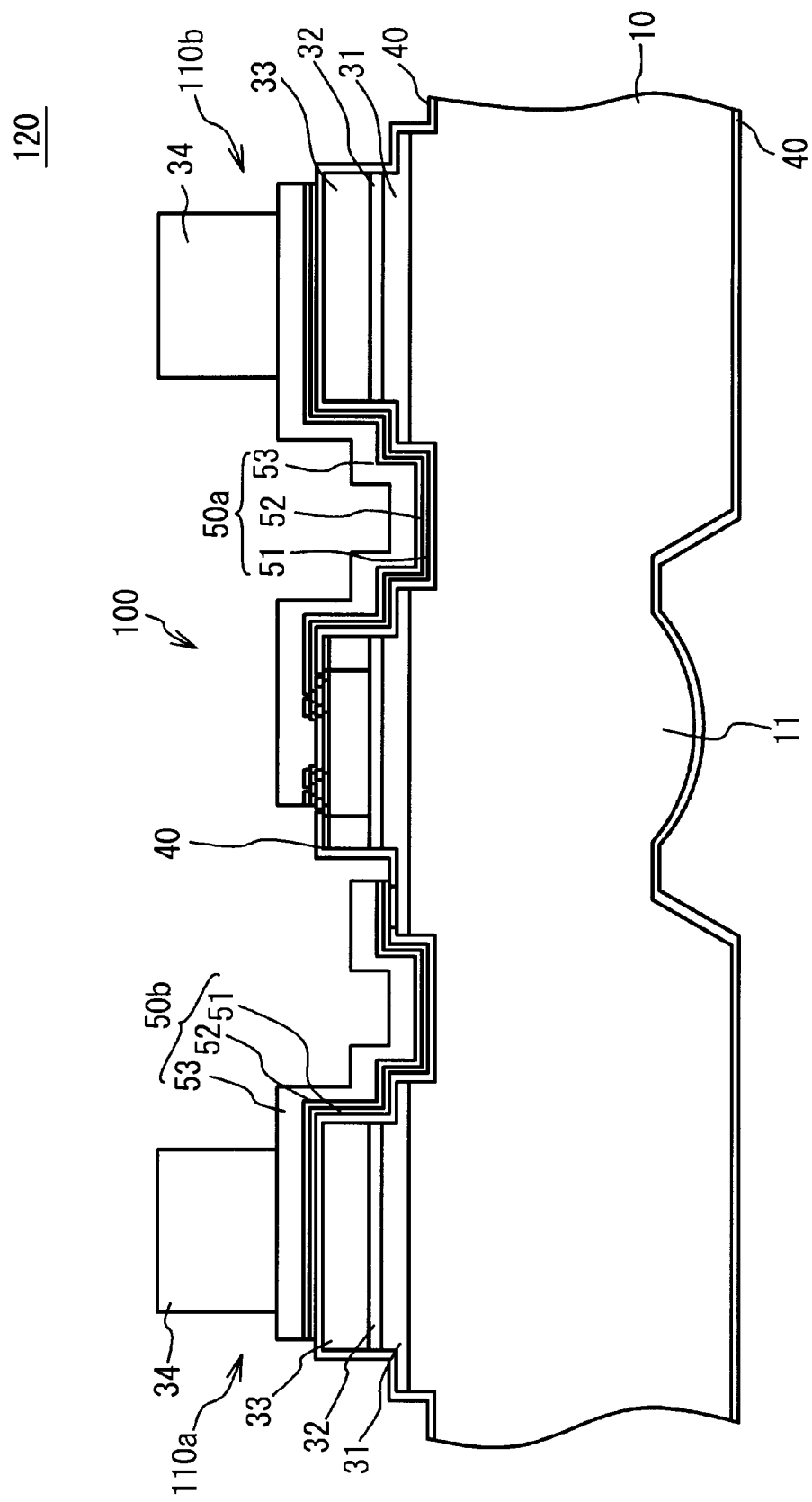
FIG. 2 illustrates a schematic cross sectional view of a semiconductor light-receiving device having a semiconductor light-receiving element in accordance with a first embodiment.
Figure 3:
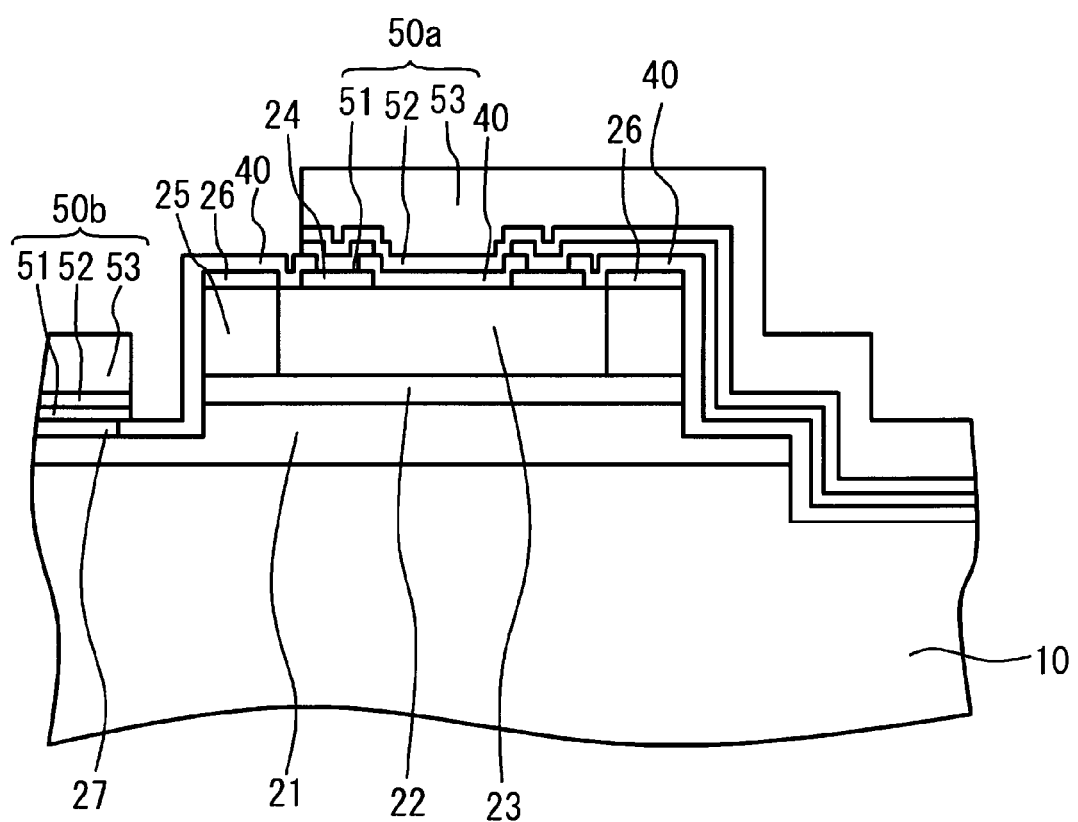
FIG. 3 illustrates an enlarged cross sectional view of the semiconductor light-receiving element.

FIG. 2 illustrates a schematic cross sectional view of a semiconductor light-receiving device 120 having a semiconductor light-receiving element 100 in accordance with a first embodiment. FIG. 3 illustrates an enlarged cross sectional view of the semiconductor light-receiving element 100.

As illustrated in FIG. 2 and FIG. 3, the light-receiving device 120 has the light-receiving element 100, a dummy mesa 110a and a dummy mesa 110b on a semiconductor substrate 10. The light-receiving element 100 has a structure in which an n-type semiconductor layer 21, an i-type semiconductor layer 22, a p-type semiconductor layer 23 and a contact layer 28 are provided on the semiconductor substrate 10 in this order. A contact layer 24 having a ring shape is formed on the p-type semiconductor layer 23. The n-type semiconductor layer 21 is, for example, comprised of n-type InP. The i-type semiconductor layer 22 is, for example, comprised of i-type InGaAs. The p-type semiconductor layer 23 is, for example, comprised of p-type InP. A thickness of the n-type semiconductor layer 21 is, for example, 1.0 μm. A thickness of the i-type semiconductor layer 22 is, for example, 1.0 μm. A thickness of the p-type semiconductor layer 23 is, for example, 1.0 μm. A diameter of the p-type semiconductor layer 23 is smaller than that of the i-type semiconductor layer 22. An n-type semiconductor layer 25 is provided on a side face of the p-type semiconductor layer 23 in a region on the i-type semiconductor layer 22. The n-type semiconductor layer 25 is, for example, comprised of n-type InP. The contact layer 24 is, for example, comprised of p-type InGaAs.

The semiconductor substrate 10 is comprised of a semi-insulated semiconductor and has resistivity of $2.2 \times 10^7$ Ωcm to $6.6 \times 10^7$ Ωcm. As an example, the semiconductor substrate 10 is comprised of semi-insulated InP. A lens 11 is formed in a region according to the light-receiving element 100 on the back face of the semiconductor substrate 10. The lens 11 focuses an incident light from the back face of the semiconductor substrate 10 on the light-receiving element 100. The lens 11 can be formed by performing a milling on the semiconductor substrate 10.

The dummy mesas 110a and 110b have a structure in which an n-type semiconductor layer 31, an i-type semiconductor layer 32 and an n-type semiconductor layer 33 are provided on the semiconductor substrate 10 in this order. The n-type semiconductor layer 31 is, for example, comprised of n-type InP. The i-type semiconductor layer 32 is, for example, comprise of i-type InGaAs. The n-type semiconductor layer 33 is, for example, comprised of n-type InP.

An insulating film 40 is, for example, comprised of silicon nitride (SiN) acting as an AR film and covers the surface of the light-receiving element 100, the surface of the dummy mesas 110a and 110b, the upper face of the semiconductor substrate 10 and the back face of the semiconductor substrate 10. A diffusion mask 26 is provided between the upper face of the n-type semiconductor layer 25 and the insulating film 40. The diffusion mask 26 is, for example, comprised of silicon nitride (SiN) and has a thickness of 0.2 μm or the like.

The insulating film 40 has an opening on the contact layer 24. A ring-shaped electrode 50a is formed in the opening of the insulating film 40 on the contact layer 24. The ring-shaped electrode 50a has a Ti/Pt layer 51 acting as a barrier layer. The Ti/Pt layer 51 also has a ring shaped because the contact layer 24 has a ring shape. An Au-sputtering layer 52 and an Au-plating layer 53 are laminated in this order from the Ti/Pt layer 51 to an inner side thereof. Therefore, the Au-sputtering layer 52 is in contact with the insulating film 40 inside of the Ti/Pt layer 51.

The extracting electrode 50a goes through the surface of the semiconductor light-receiving element 100, the upper face of the semiconductor substrate 10, the surface of the dummy mesa 110b to an upper face of the dummy mesa 110b. The extracting electrode 50a has a structure in which the Au-sputtering layer 52 and the Au-plating layer 53 are laminated in this order on the Ti/Pt layer 51. An electrode 34 is formed on the extracting electrode 50a on the dummy mesa 110b.

The insulating film 40 has an opening in a region where the i-type semiconductor layer 22 is not formed on the n-type semiconductor layer 21. A contact layer 27 is formed in the opening. The n-type semiconductor layer 21 is in contact with an extracting electrode 50b via the contact layer 27. The extracting electrode 50b has the same structure as the extracting electrode 50a. The extracting electrode 50b goes through the upper face of the semiconductor substrate 10 and the surface of the dummy mesa 110a to the upper face of the dummy mesa 110a. Another electrode 34 is formed on the extracting electrode 50b on the dummy mesa 110a.

Figure 4A:
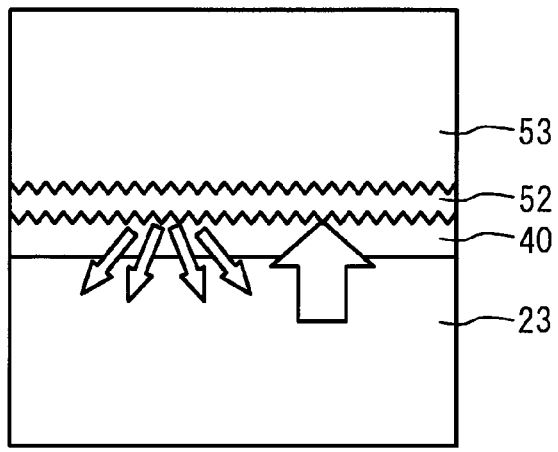
FIG. 4A illustrates an enlarged cross sectional view of the semiconductor light-receiving element.

FIG. 4A illustrates an enlarged schematic cross sectional view of an inner portion relative to the contact layer 24 in the semiconductor light-receiving element 100. In the semiconductor light-receiving element 100, a lamination structure of the p-type semiconductor layer 23 (InP), the insulating film 40 (silicon nitride film) and the Au-sputtering layer 52 acts as a reflection mirror in an inner side relative to the contact layer 24. In concrete, the Au-sputtering layer 52 acts as a reflection mirror with respect to the p-type semiconductor layer 23. A light input from the lens 11 is reflected by an interface between the insulating film 40 and the Au-sputtering layer 52. The insulating film 40 may be comprised of a silicon oxide film (SiO).

In the semiconductor light-receiving element 100, a concave and convex portion is formed on a face of at least one of metal layers of the extracting electrode 50a comprised of a metal film, on the side of the lens 11. In the embodiment, as an example, a concave and convex portion is formed on the interface between the Au-sputtering layer 52 and the insulating film 40, and another concave and convex portion is formed on the interface between the Au-sputtering layer 52 and the Au-plating layer 53. In this case, a light input from the lens 11 is diffusely reflected by the interface between the insulating film 40 and the Au-sputtering layer 52. Thus, the reflection light is reflected toward an optical axis direction that is different from the incident direction. It is therefore possible to suppress light amount returning to a light source.

Figure 4B:
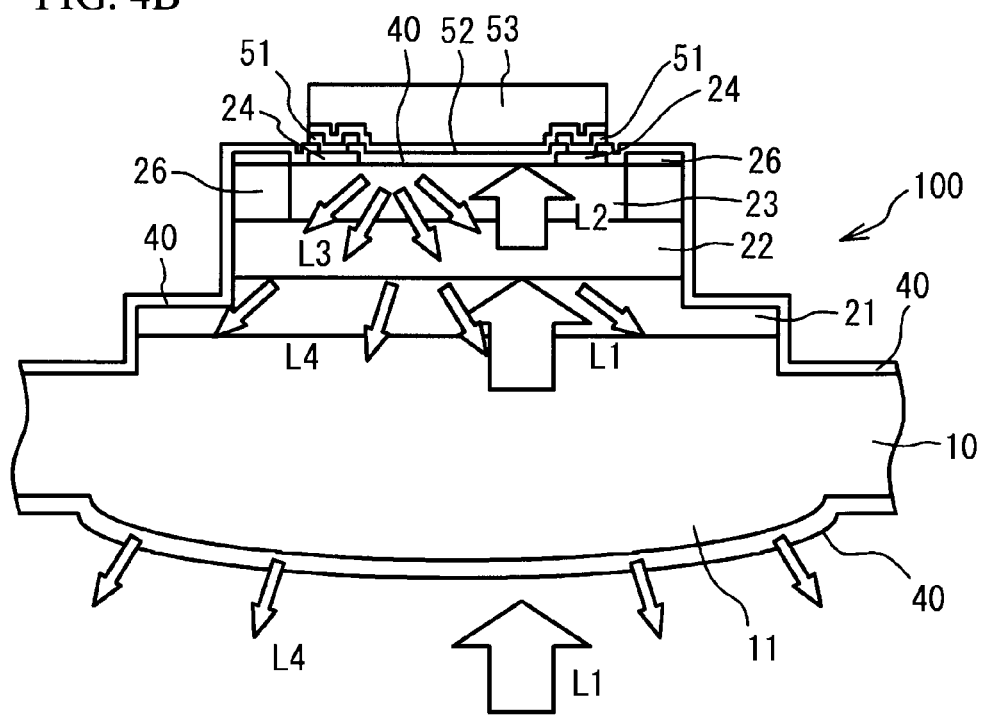
FIG. 4B illustrates a schematic view of a reflection.

FIG. 4B illustrates a schematic view of the reflection. As illustrated in FIG. 4B, a part of the light L1 input from the lens 11 is absorbed by the i-type semiconductor layer 22 acting as a light-absorbing layer. The light L2 having passed through the i-type semiconductor layer 22 is reflected by the interface between the insulating film 40 and the Au-sputtering layer 52 and is input into the i-type semiconductor layer 22 as the light L3. In this case, the light L3 is diffusely reflected toward an optical axis direction that is different from that of the light L1. A part of the light L3 is absorbed by the i-type semiconductor layer 22. The light L4 having passed through the i-type semiconductor layer 22 is output toward outside via the lens 11. (light amount of the light L1−light amount of the light L2)+(light amount of the light L3−light amount of the light L4) contributes to carrier generation in the i-type semiconductor layer 22. Because of the diffuse reflection, the light amount returning to a light source can be suppressed. It is therefore possible to suppress the ORL defect.

Figure 5A:
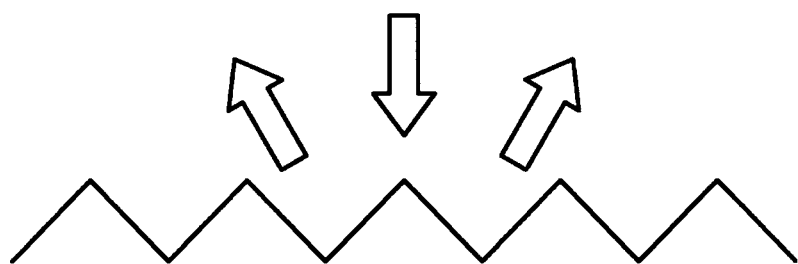
FIG. 5A through FIG. 5C illustrate a concave and convex portion formed on a face of any metal layer of an electrode made of metal films on a lens side.
Figure 5B:
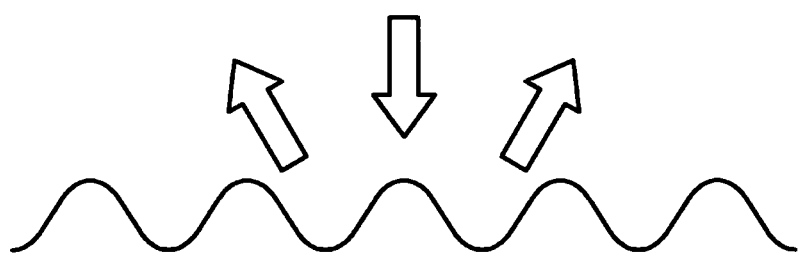
Figure 5C:
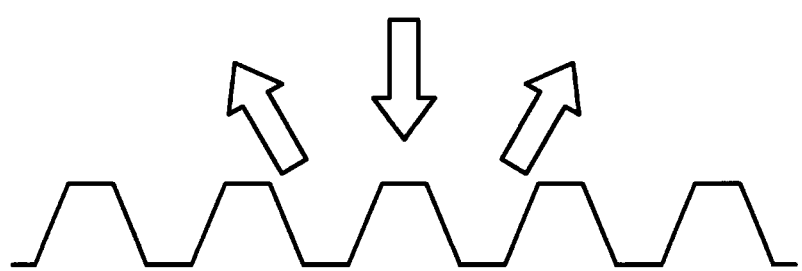

FIG. 5A through FIG. 5C illustrate a schematic view of the concave and convex portion formed on a face of any metal layer in the electrode comprised of a metal film on the side of the lens 11. As illustrated in FIG. 5A through FIG. 5C, two pitches or more concave and concave portions are formed. As illustrated in FIG. 5A, the concave and convex portion may have a zig-zag shape with a polygonal line. As illustrated in FIG. 5B, the concave and convex portion may have a wave form. As illustrated in FIG. 5C, the concave and convex portion may have a shape of a plurality of aligned trapeziums. The shape of the concave and convex portion is not limited. However, it is preferable that at least one of faces of the concave and convex portion is inclined with respect to the light incidence direction and is exposed toward the light incidence side. As an example, the pitch of the concave and convex portion is approximately 50 nm. A depth of the concave and convex portion is approximately 50 nm.

A description will be given of a method of forming the concave and convex portion. A RIE etching may be used when the concave and convex portion is formed on a face of a metal layer of an electrode comprised of a metal film. For example, the insulating film 40 having a thickness of 2150 angstrom or the like is subjected to an Ar gas of 60 sccm, a pressure of 1.5 Pa or the like, and a power of 200 W. Thus, the concave and convex portion on the face of the insulating film 40 is enlarged after the etching, compared to before the etching. Thus, the concave and convex portion illustrated in FIG. 5A can be formed on the insulating film 40. Another concave and convex portion can be formed on the Au-sputtering layer 52, when the Au-sputtering layer 52 is formed on the concave and convex portion. Further, still another concave and convex portion can be formed on the Au-plating layer 53. The concave and convex portion of FIG. 5B can be formed by changing the condition of the RIE etching. The concave and convex portion having the shape of a plurality of trapeziums on a part or all of the face of the insulating film 40 of FIG. 5C can be formed, when a resist is coated on the insulating film 40, an etching mask subjected to a patterning of exposure and development is formed, a region of the insulating film 40 exposed through the etching mask is subjected to the RIE etching.

[Modified Embodiment]

FIG. 6 illustrates a schematic cross sectional view for describing another reflection mirror. As illustrated in FIG. 6, the insulating film 40 acting as the AR film is not provided, and the contact layer 24 and the Ti/Pt layer 51 may be provided on a substantially whole face of the p-type semiconductor layer 23. In the modified embodiment, the contact layer 24 has a lamination structure in which a first layer 24a of p-type InGaAsP, a second layer 24b of p-type InGaAs and a third layer 24c of a metal such as Au/Zn/Au that can be in ohmic contact with a semiconductor are laminated in this order from the p-type semiconductor layer 23 side. An energy gap of InGaAs is smaller than that of InGaAsP. Therefore, a hetero barrier may be reduced.

In the modified embodiment, a lamination structure of the second layer 24b (p-type InGaAs) and the third layer 24c (Au/Zn/Au) acts as a reflection mirror. In concrete, the third layer 24c acts as a reflection mirror with respect to the second layer 24b. A light input from the lens 11 is reflected by an interface between the second layer 24b and the third layer 24c. In the modified embodiment, the third layer 24c acts as a metal layer included in a metal film. The p-type semiconductor layer 23 has only to be a binary mixed crystal. The first layer 24a has only to be a ternary mixed crystal. The second layer 24b has only to be a three-or-more-element mixed crystal having an energy gap smaller than that of the first layer 24a.

A description will be given of a method of forming the concave and convex portion of the modified embodiment. A thermal process may be performed when the concave and convex portion is formed on the face of the metal layer. For example, p-type InGaAsP having a thickness of 150 nm is formed on the p-type semiconductor layer 23 as the first layer 24a. Next, p-type InGaAs having a thickness of 100 nm is formed on the first layer 24a as the second layer 24b. Next, the third layer 24c having a structure in which Au (20 nm), Zn (15 nm) and Au (60 nm) are laminated in this order is formed on the second layer 24b. Next, the Ti/Pt layer 51 having a structure in which Ti (50 nm) and Pt (100 nm) are laminated in this order is formed on the third layer 24c. Next, the Au-sputtering layer 52 having a thickness of 100 nm is formed on the Ti/Pt layer 51. The Au-plating layer 53 is formed on the Au-sputtering layer 52. After that, a thermal process is performed for 30 seconds or the like in a nitrogen atmosphere in a temperature range of 350 degrees C. to 400 degrees C. Through the thermal process, the semiconductor (p-type InGaAs) of the second layer 24b and the metal (Au/Zn/Au) of the third layer 24c react with each other. Thus, the concave and convex portion is formed on the third layer 24c. The shape of the concave and convex portion is that of FIG. 5A. In this case, the concave and convex portion may be large. And, the concave and convex portion may have an influence on the p-type semiconductor layer 23. When the contact layer 24 has a large thickness, the problem may be solved. However, when the p-type InGaAs is used for all of the contact layer 24, a light is absorbed by the p-type InGaAs, and a reflection light does not occur. Therefore, in the modified embodiment, the contact layer 24 has the structure in which the first layer 24a of the p-type InGaAsP, the second layer 24b of the p-type InGaAs and the third layer 24c of the metal (Au/Zn/Au or the like) that can be in ohmic contact with a semiconductor are laminated in this order. The light absorption may be suppressed, when a part of the contact layer 24 is the first layer 24a of the p-type InGaAsP.

[Second Embodiment]

Figure 7:
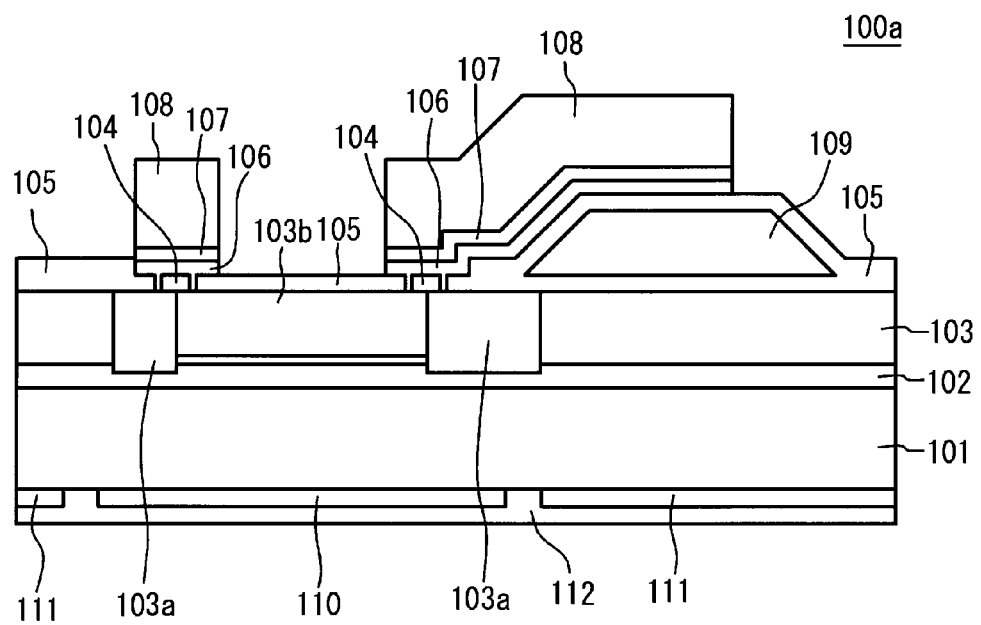
FIG. 7 illustrates a schematic cross sectional view of a front face incident type semiconductor light-receiving element in accordance with a second embodiment.

FIG. 7 illustrates a schematic cross sectional view of a front face incident type semiconductor light-receiving element 100a in accordance with a second embodiment. As illustrated in FIG. 7, the semiconductor light-receiving element 100a has a structure in which a light-absorbing layer 102 and a window layer 103 are laminated in this order on an n-type semiconductor substrate 101. The n-type semiconductor substrate 101 is, for example, comprised of n-type InP. The light-absorbing layer 102 is, for example, comprised of i-type InGaAs. The window layer 103 is, for example, comprised of n-type InP. In the window layer 103, a p-type impurity region 103a into which a p-type impurity is doped in a ring shape is formed. A p-type window layer 103b into which a p-type impurity is diffused is formed in an inner side of the ring of the p-type impurity region 103a.

A ring-shaped contact layer 104 is provided on an upper face of the p-type window layer 103b. The contact layer 104 is, for example, comprised of InGaAs. The contact layer 104 surrounds the p-type window layer 103b. A silicon nitride film 105 is provided in an inner side relative to the contact layer 104 on the p-type window layer 103b. The silicon nitride film 105 is formed outside of the contact layer 104 on the window layer 103.

A Ti/Pt layer 106, an Au-sputtering layer 107 and an Au-plating layer 108 are laminated in this order on the contact layer 104. The Ti/Pt layer 106, the Au-sputtering layer 107 and the Au-plating layer 108 act as an extracting electrode. The extracting electrode is connected to another device via on the silicon nitride film 105. The silicon nitride film 105 may have a given thickness because of a resin 109 therein.

A silicon nitride film 110 acting as an AR film is provided in a region corresponding to the p-type window layer 103b on a back face of the n-type semiconductor substrate 101. An AuGe/Au film 111 that is in ohmic contact with a semiconductor is spaced from the silicon nitride film 110, outside of the silicon nitride film 110. Further, an electrode 112 having a lamination structure of Ti/Au/TiW/Au is provided so as to cover the silicon nitride film 110 and the AuGe/Au film 111, on the back face of the n-type semiconductor substrate 101.

In the semiconductor light-receiving element 100a, a light input into the p-type window layer 103b passes through the light-absorbing layer 102, is reflected by the electrode 112 of the metal layer, passes through the light-absorbing layer 102 again and is output outward. In the second embodiment, the concave and convex portion described in the first embodiment is formed on the face of at least one of the metal layers of the electrode 112 on the side of the light-absorbing layer 102. Thus, a light is diffusely reflected by the electrode 112. The light reflected by the electrode 112 is reflected toward a direction that is different from the incidence direction. Thus, a light amount returning to a light source can be suppressed.

The light-receiving elements described above have a structure in which an i-type semiconductor layer and a p-type semiconductor layer are laminated on an n-type semiconductor layer. However, the light-receiving elements may have an opposite structure.

The present invention is not limited to the specifically disclosed embodiments and variations but may include other embodiments and variations without departing from the scope of the present invention.

What is claimed is:

1. A method of manufacturing a semiconductor light-receiving element comprising:
   growing a one-conductivity-type semiconductor layer having a first conduction type, a light-absorbing layer and an opposite-conductivity type semiconductor layer having a second conduction type opposite to the first conduction type, in this order from a light incidence side;
   forming an insulating film on the opposite-conductivity-type semiconductor layer;
   forming a selective etching mask on a face of the insulating film;
   forming a concave and convex portion on the face of the insulating film by performing an etching against a part or all of a thickness of the insulating film exposed through the selective etching mask; and
   forming a metal film on the face of the insulating film including the concave and convex portion.

2. The method as claimed in claim 1 wherein the insulating film is silicon nitride.

3. The method as claimed in claim 1, wherein the semiconductor light-receiving element is a back-face-incident-type light-receiving element.

4. The method as claimed in claim 3, wherein:
   the one-conductivity-type semiconductor layer is formed on a one-conductivity-type semiconductor substrate; and
   the method further comprises forming a lens by performing a milling against the one-conductivity-type semiconductor substrate.

5. The method as claimed in claim 1 further comprising forming an extracting electrode on the metal film and on a dummy mesa.

6. The method as claimed in claim 1, wherein at least one of faces of the concave and convex portion is formed so as to be inclined with respect to a light incidence, in the forming of the concave and convex portion.

7. A method of manufacturing a semiconductor light-receiving element comprising:
   growing a one-conductivity-type semiconductor layer having a first conduction type, a light-absorbing layer, and an opposite-conductivity-type semiconductor layer having a second conduction type opposite to the first conduction type, in this order;
   forming an insulating film on the opposite-conductivity-type semiconductor layer;
   enlarging a concave and convex portion of the insulating film in a face subjected to an etching compared to before the etching, by performing the etching to the insulating film; and
   forming a metal film on a face of the insulating film including the concave and convex portion.

8. The method as claimed in claim 7 wherein the insulating film is silicon nitride.

9. The method as claimed in claim 7, wherein the semiconductor light-receiving element is a back-face-incident-type light-receiving element.

10. The method as claimed in claim 9, wherein:
    the one-conductivity-type semiconductor layer is formed on a one-conductivity-type semiconductor substrate; and the method further comprises forming a lens by performing a milling against the one-conductivity-type semiconductor substrate.

11. The method as claimed in claim 7 further comprising forming an extracting electrode on the metal film and on a dummy mesa.

12. The method as claimed in claim 7, wherein at least one of faces of the concave and convex portion is formed so as to be inclined with respect to a light incidence, in the forming of the concave and convex portion.

* * * * *